United States Patent [19]

Suzuki et al.

[11] Patent Number: 4,858,241

[45] Date of Patent: Aug. 15, 1989

[54] SEMICONDUCTOR LASER DEVICE

[75] Inventors: Nobuo Suzuki, Tokyo; Motoyasu Morinaga, Yokohama; Hideto Furuyama, Tokyo; Yuzo Hirayama; Hajime Okuda, both of Yokohama; Masaru Nakamura, Kawaguchi; Nawoto Motegi, Kanagawa, all of Japan

[73] Assignee: Kabushiki Kaisha Toshiba, Kawasaki, Japan

[21] Appl. No.: 198,859

[22] Filed: May 26, 1988

[30] Foreign Application Priority Data

May 26, 1987 [JP] Japan ................................. 62-126944
Jan. 20, 1988 [JP] Japan ..................................... 63-8267
Jan. 21, 1988 [JP] Japan ..................................... 63-9587

[51] Int. Cl.$^4$ ................................................ H01S 3/19
[52] U.S. Cl. ..................................................... 372/46
[58] Field of Search ............................. 372/45, 46, 44

[56] References Cited

U.S. PATENT DOCUMENTS 4,662,988  5/1987  Renner ................................... 372/43
4,692,926  9/1987  Marschall et al. ..................... 372/46
4,725,112  2/1988  Bridges et al. ......................... 372/46

Primary Examiner—James W. Davie
Attorney, Agent, or Firm—Oblon, Spivak, McClelland, Maier & Neustadt

[57] ABSTRACT

A semiconductor laser device comprises a semiconductor mesa portion formed above semiconductor substrate by a predetermined interval, an active region, formed between the mesa portion and semiconductor substrate and consisting of a semiconductor having a forbidden band width smaller than those of the mesa portion and semiconductor substrate, for contributing to light emission, a pair of buried portions formed at both sides in a widthwise direction of and in contact with the active region and consisting of a semiconductor having a forbidden band width larger than that of the active region, a total width of the buried portions and the active region being smaller than that of the mesa portion, thereby forming a gap at a side of each of the buried portions between the mesa portion and semiconductor substrate to electrically insulate the mesa portion and semiconductor substrate, and supporting portions formed integrally with the mesa portion so as to support the mesa portion with respect to the substrate in association with the active region and the buried portions.

10 Claims, 10 Drawing Sheets

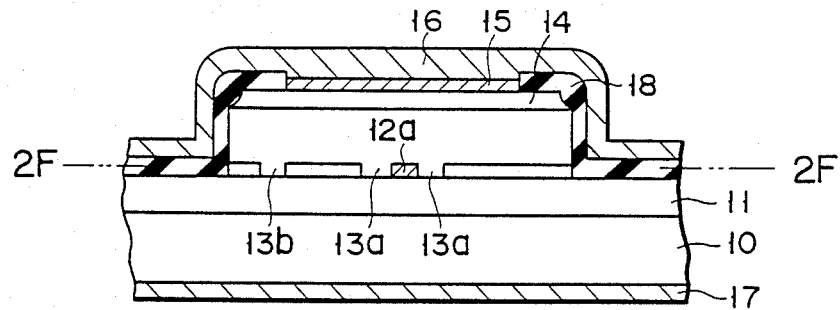
F I G. 2E
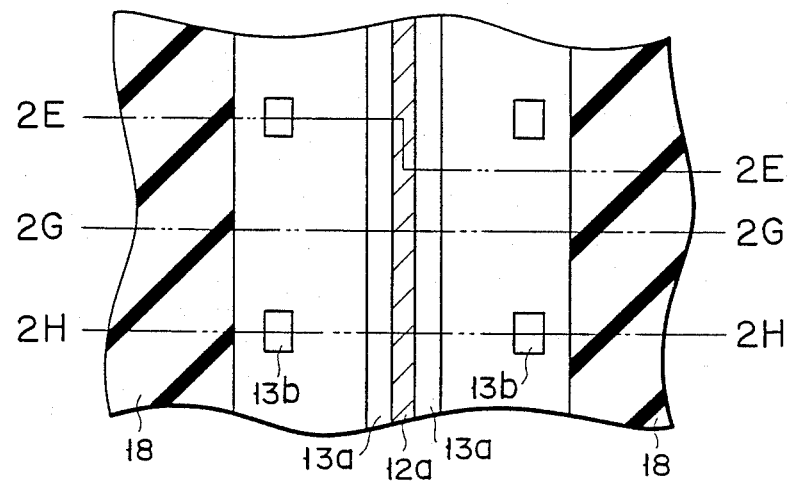
F I G. 2F
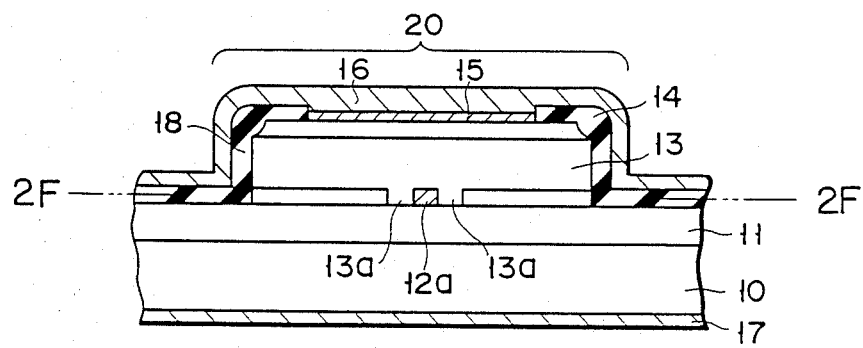
F I G. 2G

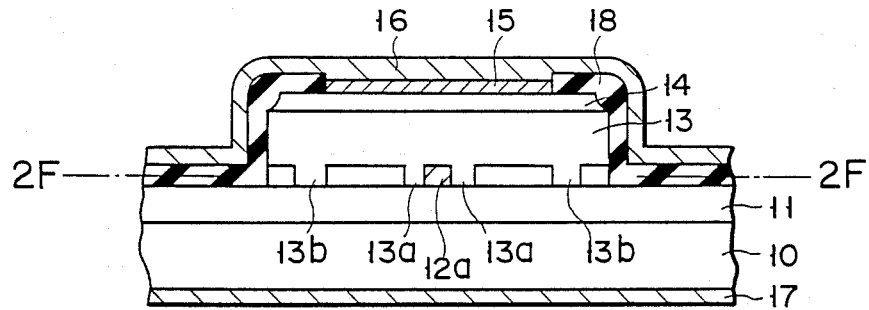
F I G. 2H
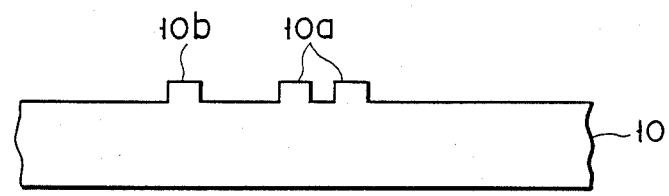
F I G. 3A
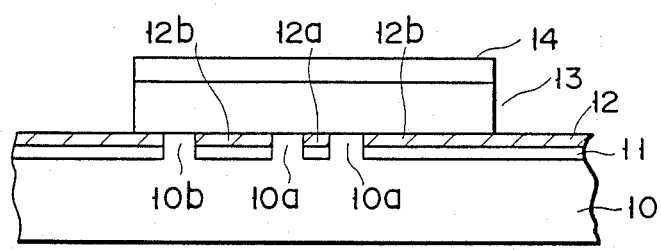
F I G. 3B

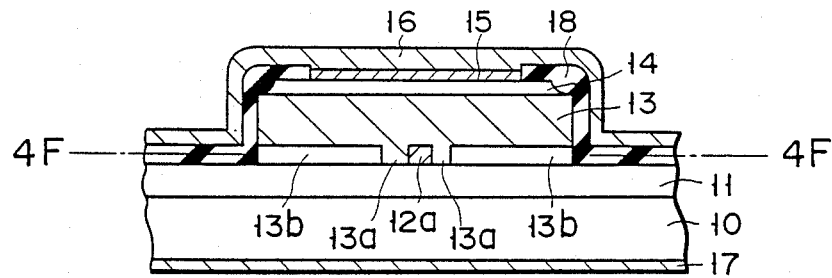
F I G. 4E
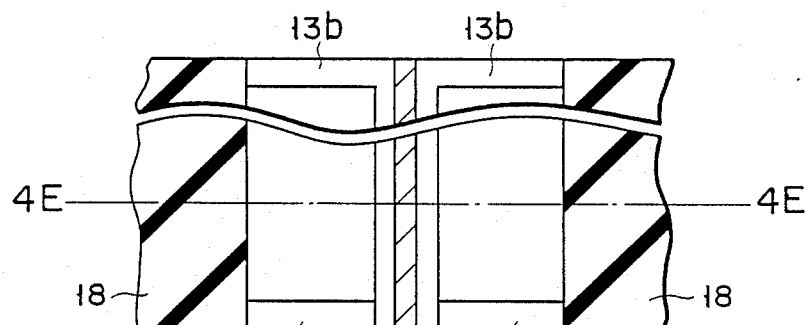
F I G. 4F
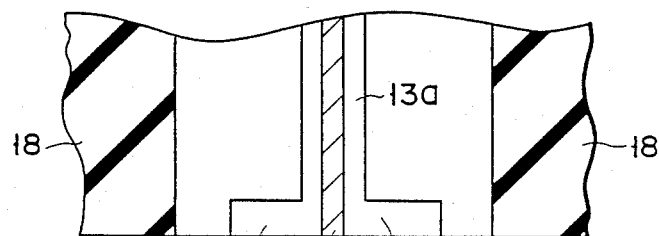
F I G. 4G
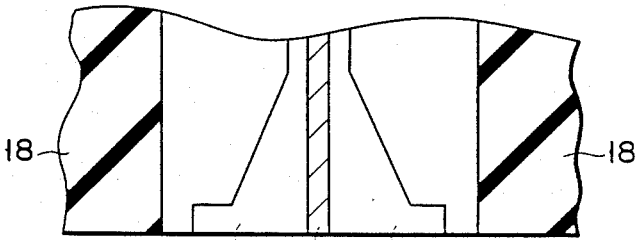
F I G. 4H

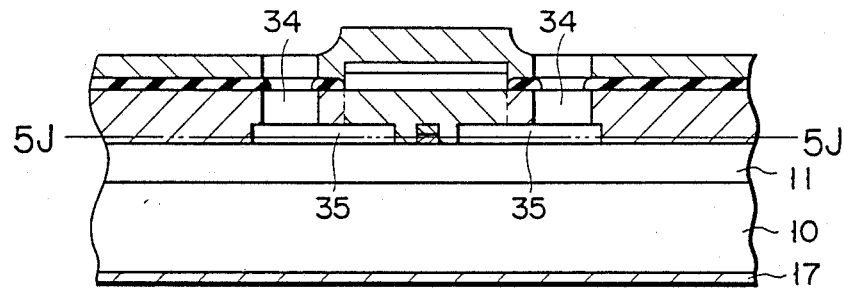
F I G. 5 I
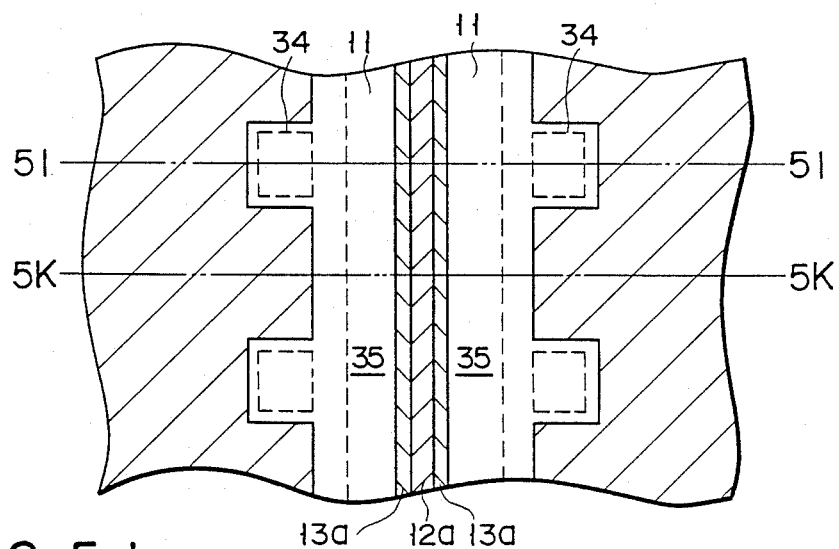
F I G. 5J
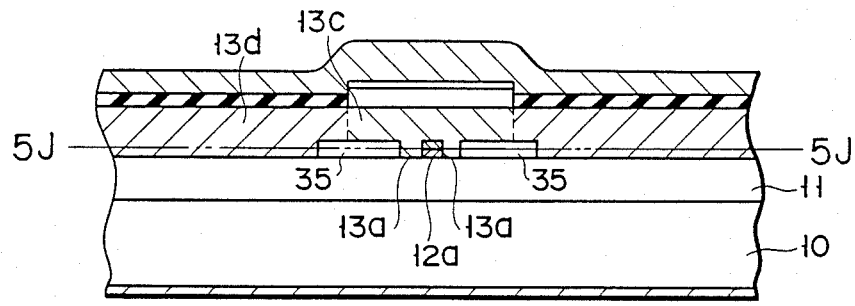
F I G. 5K

SEMICONDUCTOR LASER DEVICE

BACKGROUND OF THE INVENTION

1. Field of the Invention

The present invention relates to a semiconductor light-emitting device such as a refractive index waveguide laser or a double heterojunction light-emitting diode and a method of manufacturing the same and, more particularly, to a semiconductor light-emitting device in which an active region is surrounded by a semiconductor layer whose forbidden band width is larger than that of the active region, wherein the active region has opposed edge surfaces which serve as mirrors, oscillate a laser beam between the edge surfaces and emit the laser beam for one of the edge surfaces and a method of manufacturing the same.

2. Description of the Related Art

Recently, various semiconductor light-emitting devices having a double heterostructure have been developed. In the semiconductor light-emitting devices of this type, it is very important to satisfy the following conditions A to C.

A. In order to improve light-emitting efficiency, a current must be flowed efficiently to only a light-emitting region or active region having a size controlled to be very small.

B. In order to reduce contact resistance, an electrode must be formed throughout a wide region.

C. When high-speed modulation must be performed as in a light-emitting device for optical communication, an area of a p-n junction is minimized in order to reduce a junction capacitance.

A known example of a semiconductor light-emitting device for optical communication which more or less satisfies the above three conditions is a mesa laser utilizing a mass transport technique (e.g., Y. Hirayama et al. "Low Temperature and rapid mass transport technique for GaInAsP/InP DFB lasers, Inst. Phys. Conf. Ser. No. 79: Chapt 3 Paper presented at Int. Symp. GaAs and Related Compounds Karuizawa, Japan, 1985 p. 175,186). Such a semiconductor light-emitting device is called an MT laser. A method of manufacturing the MT laser and characteristics of the MT laser will be described below with reference to the accompanying drawings.

FIGS. 1A to 1D are sectional views schematically showing manufacturing steps of a conventional MT laser. First, as shown in FIG. 1A, 3-$\mu$m thick n-type InP buffer layer 2, 0.1-$\mu$m thick undoped GaInAsP active layer 3 having a composition which enables emission of light having a wavelength of 1.3 $\mu$m, 1.5-$\mu$m thick p-type InP clad layer 4, and 0.8-$\mu$m thick p+-type GaInAsP cap layer 5 which emits light having a wavelength of 1.15 $\mu$m and enables good ohmic contact are sequentially crystal-grown on n-type (100) InP substrate 1.

Then, as shown in FIG. 1B, layers 4, 5 are mesa-etched so that active layer 3 is exposed and a mesa strip having a width of 15 $\mu$m is formed, which allows relatively easy mask alignment. At this time, when hydrochloric acid is used to remove InP layer 4, etching can be automatically stopped at active layer 3 by selectivity of the acid.

Thereafter, as shown in FIG. 1C, both sides of active layer 3 are etched by an etchant consisting of sulfuric acid + hydrogen peroxide + water (4:1:1) to form an active region having a width of about 1 $\mu$m. At this time, InP is almost not etched, and only GaInAsP is etched. Although cap layer 5 is also etched, it is etched to a depth only about ⅓ that of active layer 3 due to a difference in composition. In order to obtain fundamental transverse oscillation and a low oscillation threshold current, the width of active layer 3 must be precisely controlled to be around 1 $\mu$m.

Then, as shown in FIG. 1D, in consideration of light leakage in a transverse mode and mechanical strength, an InP layer is buried in the deep gap of active layer 3 formed by etching, thereby forming a so-called buried heterostructure (BH). In the MT laser, the MT technique is used to bury and grow the InP layer. That is, InP is grown faster in the gap portion when phosphorus is doped at a high temperature (670° C.) and high pressure. Note that when InCl$_3$ is used as an additive agent, InP can be rapidly grown at a lower temperature.

SiO$_2$ film 6 is formed as an insulating film throughout the entire upper surface of the above element, and a window is formed in a contact portion of this insulating film. Then, AuZn is formed as p-side electrode 7 by a lift-off technique and heated to perform alloying. Au-Cr is deposited on electrode 7 and insulating film 6 to form electrode 8. N-side electrode 9 is formed on substrate 1, thereby completing the MT laser.

The above MT laser can concentrate a current at active region 3 by a difference between built-in potentials of GaInAsP of active region 3 and InP of the buried portion. Since a junction is formed only at the mesa portion, a junction capacitance is small, and therefore high-speed response can be advantageously obtained. Furthermore, the width of electrode 7 can be formed to be about 10 $\mu$m.

However, in the MT laser of this type, controllability of the width of the active region poses a problem. That is, when selective etching is performed from the both ends of the active layer having a width of 15 $\mu$m to form an active region having a width of 1 $\mu$m, it is difficult to precisely stop etching to obtain a width of 1 $\mu$m. Therefore, the entire active layer is sometimes etched, resulting in poor manufacture yield. Accuracy of etching is degraded as a mesa width is increased. For this reason, the mesa width cannot be set to be 15 $\mu$m or more. In addition, in consideration of mask alignment margin, the width of the ohmic electrode portion must be 10 $\mu$m or less. For this reason, the contact resistance cannot be sufficiently reduced. Moreover, an area of the InP junction of the buried portion is defined by the width of the mesa portion and therefore cannot be controlled to be narrower than that. Since even if the active region may be formed to have a desired narrow width, the mesa region must be mechanically supported in the active layer having a narrow width as described above, distortion is concentrated in the active layer. Particularly, insulating film 6 has a different coefficient of thermal expansion from that of the semiconductor, resulting in the cause for distortion and stress. Therefore, the manufacture yield and reliability are degraded.

Note that although the area of the buried portion can be adjusted by controlling a time of the MT step, is controllability is very poor. For this reason, the width of the buried InP junction portion cannot be reduced to reduce the junction capacitance, thereby seriously interfering with realization of high performance. In order to reduce the junction capacitance and to increase a rise voltage in the junction portion so as to reduce current leakage, a carrier density in the buried junction portion must be optimized. However, since the carrier density is not controlled in the conventional MT technique, the density in the junction portion cannot be defined, resulting in a serious problem in design.

As described above, in the conventional MT technique, it is difficult to precisely set the width of the active region, and therefore high performance of the buried semiconductor light-emitting device is significantly interfered. In addition, when the area of the buried portion is reduced, the contact area is reduced to increase the contact resistance. When the contact area is increased, the buried area is increased to increase the junction capacitance, and it is difficult to control the width of the active region.

SUMMARY OF THE INVENTION

It is an object of the present invention to provide a high-performance semiconductor light-emitting device in which a width of an active region can be adjusted with high controllability, a junction area, a carrier density, and the like of a junction portion can be optimized, and a contact resistance can be reduced, which has good reliability and manufacture yield, and which can perform high-speed modulation, and a method of manufacturing the same.

BRIEF DESCRIPTION OF THE DRAWINGS

FIGS. 2A to 2H are sectional views showing a method of manufacturing a semiconductor laser device according to the first embodiment of the present invention, in which FIGS. 2E to 2H show a completed semiconductor laser device, in which FIG. 2F is a sectional view taken along line 2F—2F in FIGS. 2E, 2G, and 2H, and FIGS. 2E, 2G, and 2H are sectional views taken along lines 2E—2E, 2G—2G, and 2H—2H in FIG. 2F, respectively;

FIGS. 3A and 3B are sectional views showing a method of manufacturing a semiconductor laser device according to the second embodiment of the present invention in an order of steps;

FIGS. 4A to 4F are sectional views showing a method of manufacturing a semiconductor laser device according to the third embodiment of the present invention, in which FIGS. 4E and 4F show a completed semiconductor laser device, in which FIG. 4E is a sectional view taken along line 4E—4E in FIG. 4F, and FIG. 4F is a sectional view taken along line 4F—4F in FIG. 4E;

FIGS. 4G and 4H are sectional views similar to FIG. 4F and showing modifications of the third embodiment;

FIGS. 5A to 5K are sectional views showing a method of manufacturing a semiconductor laser device according to the fourth embodiment of the present invention in an order of steps, in which FIGS. 5I to 5K show a completed semiconductor laser device, in which FIGS. 5I and 5K are sectional views taken along lines 5I—5I and 5K—5K in FIG. 5J, respectively, and FIG. 5J is a sectional view taken along line 5J—5J in FIGS. 5I and 5K.

DETAILED DESCRIPTION OF THE PREFERRED EMBODIMENTS

Figure 1A:
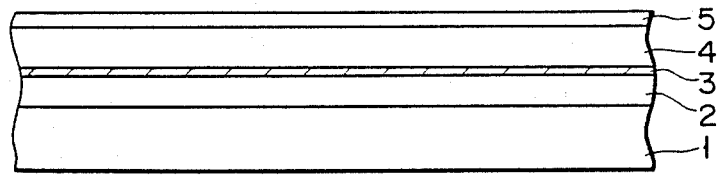
FIGS. 1A to 1D are sectional views showing a method of manufacturing a conventional semiconductor laser device in an order of steps.
Figure 1B:
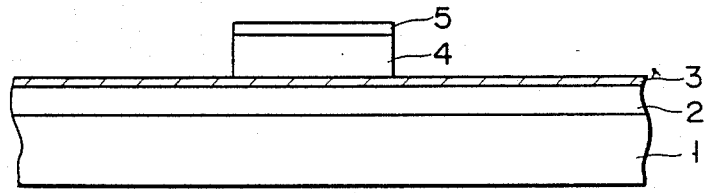
Figure 1C:
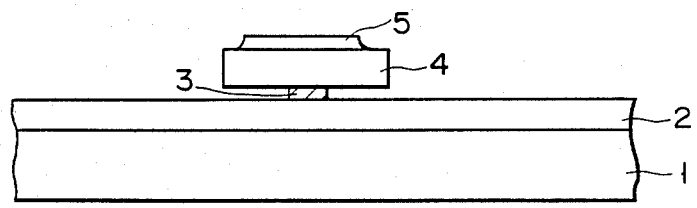
Figure 1D:
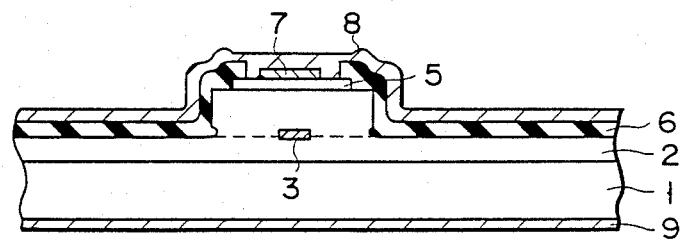

Embodiments of the present invention will be described below with reference to the accompanying drawings. Note that in the respective embodiments, parts provided at substantially the same portion or those having substantially the same functions are denoted by the same reference numerals and a detailed description thereof will be omitted.

Figure 2A:
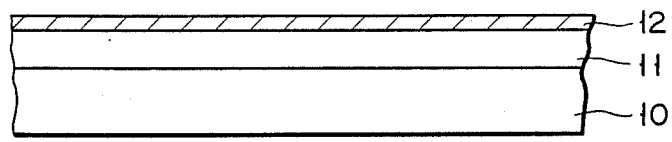

FIGS. 2A to 2E are sectional views of steps showing a method of manufacturing a GaInAsP/InP semiconductor laser device according to the first embodiment of the present invention. First, as shown in FIG. 2A, 3-$\mu$m thick n-type InP buffer layer (first semiconductor layer) 11 is formed on n-type InP substrate 10 having a (100) crystal plane as its major surface, and then 0.1-$\mu$m thick undoped GaInAsP active layer (second semiconductor layer) 12 for enabling emission of light having a wavelength of 1.3 $\mu$m is formed thereon. It will be easily understood that layer 12 consists of a semiconductor whose forbidden band width is narrower than those of semiconductors constituting layer 11 and clad layer 13 to be described later.

Figure 2B:
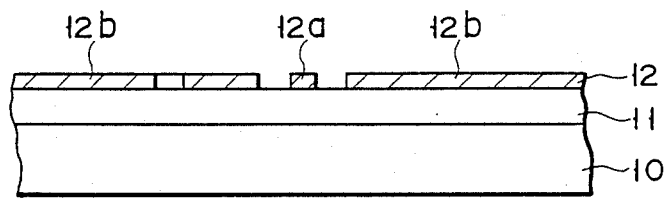

Then, as shown in FIG. 2B, layer 12 is selectively etched to form a pair of narrow grooves so that layer 12 is divided in central active region 12a and side active regions 12b located at its both sides through the grooves. In order to form a support to be described later, regions 12b are partially etched to form rectangular portions or windows. In this embodiment, 10 rectangular windows are formed at equal intervals along the longitudinal direction on one side of region 12a, i.e., a total of 20 rectangular portions are formed (in FIG. 2B, only a left side portion is shown). Alternately another shaped window or windows may be formed. In this case, etching is set such that the width of finally obtained region 12a is 1 $\mu$m and the width of grooves to be formed by etching at both sides of region 12a is 2 $\mu$m. With these dimensions, sufficient fundamental transverse mode oscillation can be obtained by region 12a, sufficient light leakage in the transverse mode can be obtained in a buried portion which is formed in the grooves later, and a junction capacitance can be reduced.

Figure 2C:
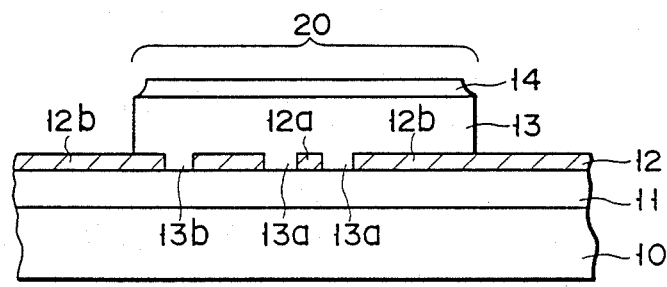

Then, 1.5-$\mu$m thick p-type InP clad layer (third semiconductor layer) 13 is formed on the entire surface (portion where layers 12 and 11 are exposed), and then 1-$\mu$m thick p+-type GaInAsP cap layer 14 is formed thereon. Both sides portions of layers 13 and 14 are removed by etching (mesa etching) by an etchant as illustrated in a conventional method, thereby forming mesa portion 20 consisting of a remaining portion. In this mesa etching, dimensions are set such that region 12a is located at the center of formed mesa portion 20 and the rectangular etching-removed portions are located near its periphery. As a result, as shown in FIG. 2C, layer 13 integrally extends to the grooves at the both sides of region 12a and the rectangular etching-removed portion, thereby forming a pair of stripe buried portions 13a and rectangular supports 13b. In this embodiment, the liquid phase epitaxial growth method (LPE method) is used for crystal growth. As a result, an upper surface of finally obtained layer 14 is flattened to facilitate formation of an electrode as will be described later. Note that if a metal organic chemical vapor deposition method (MOCVD method) is used for crystal growth, a resultant step on the upper surface of layer 14 is maximally 0.1 μm or less, i.e., layer 14 is almost flat (layer 14 is substantially flattened). In the latter method, as compared with the former method, controllability of the layer thickness is improved, and therefore element characteristics can be uniformized and the manufacture yield can be improved.

Figure 2D:
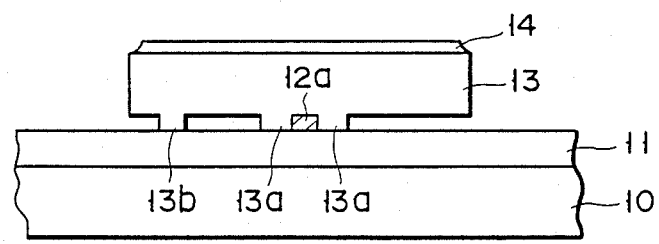

Then, as shown in FIG. 2D, only a portion where layer 12 is exposed, i.e., regions 12b are selectively etched by a sulfuric acid + hydrogen peroxide + water (4:1:1) solution. Since such an etchant acts on GaInAsP but does not act on InP, etching of regions 12b is automatically stopped at InP buried portions 13a, and region 12a having a desired width and buried portions 13a can be left with very high reproducibility. Note that in this case, layer 14 is also etched because it consists of GaInAsP. However, since layer 14 is much thicker than regions 12b and its composition ratio largely differs from GaInAsP of regions 12b, etching amount of layer 14 is very small.

Then, 0.5-μm thick SiO₂ film 18 is formed on the entire exposed surface. A portion of film 18 located on the upper surface of layer 14 is etched while leaving its periphery, thereby exposing layer 14. An Au/Zn/Au film is deposited on the exposed surface of layer 14 to form 25-μm width p-side ohmic electrode 15. Then, as shown in FIG. 2E, an Au/Cr film is deposited on electrode 15 and film 18 to form p-side electrode 16. Thereafter, a 0.5-μm thick Au/Au-Ge film is deposited on the lower surface of substrate 10 to form n-side electrode 17, thereby completing a buried type semiconductor laser device.

The device manufactured as described above is shown in FIGS. 2F to 2H. In FIG. 2F, lines 2E—2E, 2G—2G, and 2H—2H are cut lines of the devices shown in FIGS. 2E, 2G, and 2H, respectively. Line 2F—2F in each of FIGS. 2G and 2H is a cut line of FIG. 2F.

In the above semiconductor laser device, the widths of region 12a and buried portions 13a can be defined to be designed sizes with high reproducibility. In addition, since the width of electrode 15 can be sufficiently widened to be, e.g., 25 μm, the contact resistance can be sufficiently reduced. Therefore, the widths of region 12a and buried portions 13a can be optimized without the influence of the width of the ohmic electrode, to improve the characteristics. Supports 13b which are formed integrally with layer 13 to support layer 13 are partially interposed between layers 11 and 13 from which the parts of region 12b are removed. Therefore, since distortion is not concentrated on region 12a, the device is structurally stabilized, and the manufacture yield and reliability are improved. The manufacture yield is improved also because the width of region 12a can be accurately defined. Since the width of the buried region can be reduced, a stray capacitance can be reduced, a response characteristic can be improved, and thereby high-speed modulation can be performed. Furthermore, unlike in the conventional MT technique, crystal growth need not be performed into a narrow gap portion but can be performed in a near-planar state. As a result, no stress is produced, and reliability can be improved.

A manufacturing method according to the second embodiment of the present invention will be described below with reference to FIGS. 3A and 3B.

In the second embodiment, unlike in the above first embodiment, the width of an active region is defined utilizing projections on a substrate instead of stripe-etching an active layer to form an active region.

As shown in FIG. 3A, two parallel elongated mesas 10a having a width of 2 μm and a height of 1 μm are formed with an interval of 1 μm in the widthwise direction at the center of n-type InP substrate 10. At the same time, island-like rectangular projections 10b are formed. Strip mesas 10a and projection 10b correspond to buried portions 13a and support 13b in the first embodiment, respectively, and hence their arrangement and number may be substantially the same as those of buried portions 13a and support 13b. Mesas 10a and projection 10b can be easily formed at the same time by selective etching using a mask having corresponding openings.

Then, as shown in FIG. 3B, 0.5-μm thick n-type InP buffer layer 11 (first semiconductor layer) and 0.1-μm GaInAsP active layer (second semiconductor layer) 12 are crystal-grown on substrate 10 so that they are not deposited on mesas 10a and projection 10b. In this state, central active region 12a having a width equal to the interval between two mesas 10a is formed therebetween, and side active regions 12b are formed at both sides of mesas 10a. For forming GaInAsP active layer 12, if an LPE method is used, no mask is provided on the mesas 10a and projecting 10b, but if an MOCVD method is used, masks are mounted.

Thereafter, as in the first embodiment, clad and cap layers 13 and 14 are formed and mesa-etched to form a mesa portion. Then, regions 12b are removed by selective etching, and an electrode is formed, thereby completing a semiconductor laser device.

It will be easily understood that the semiconductor laser device according to the second embodiment formed as described above achieves the same effects as obtained by the first embodiment.

Figure 4A:
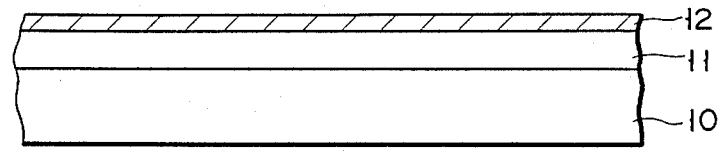

A GaInAsP/InP semiconductor laser device according to the third embodiment of the present invention will be described below with reference to FIGS. 4A to 4F. First, as shown in FIG. 4A, 3-μm thick n-type InP buffer layer (first semiconductor layer) 11 is formed on n-type InP substrate 10 having a (100) crystal plane as its major surface, and 0.1-μm thick undoped GaInAsP active layer (second semiconductor layer) 12 for enabling emission of light having a wavelength of 1.3 μm is formed thereon.

Figure 4B:
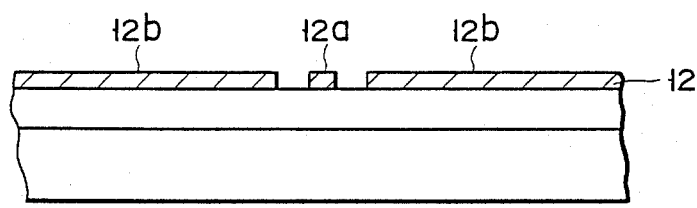

Then, as shown in FIG. 4B, layer 12 is selectively etched to form a pair of grooves so that it is divided in central active region 12a and side active regions 12b. At this time, etching is performed so that both ends of each etched groove are widened (wide portions are formed), i.e., the etched portions form U shapes opposite to each other and region 12a is located therebetween. In this case, etching is set such that the width of finally obtained region 12a is 1 μm and the widths of the etched grooves except for their both ends are 2 μm. With these dimensions, sufficient fundamental transverse mode oscillation can be obtained by region 12a, sufficient light leakage in the transverse mode at buried portions to be formed in the groove later can be obtained, and a junction capacitance can be reduced.

Figure 4C:
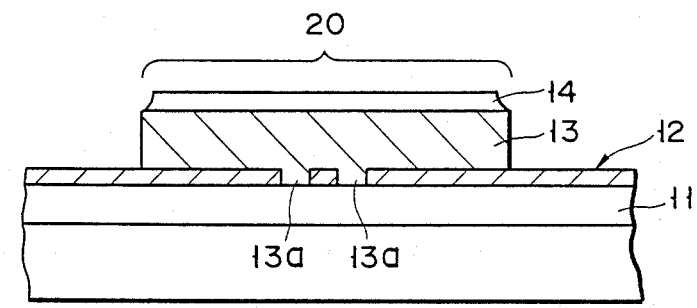

Then, 1.5-μm thick p-type InP clad layer (third semiconductor layer) 13 is formed on the entire surface (portion where layers 12 and 11 are exposed), and 1-μm thick p+-type GaInAsP cap layer 14 is grown thereon. Peripheries of layers 13 and 14 are removed by etching (mesa etching) to form mesa portion 20 consisting of the remaining portion. In this mesa etching, dimensions are set such that region 12a is located at the center of formed mesa portion 20 and the wide edge portions located at the both ends of the etched portions are located at the periphery. As a result, as shown in FIG. 4C, layer 13 partially extends into the grooves at the both sides of region 12a to integrally form a pair of buried portions. The shape of the buried portions corresponds to the U shape of the etched portions, i.e., central portions 13a forms a stripe extending along region 12a and both end portions 13b (wide portions) form stripes perpendicular to the central portion (the shape of the buried portions can be easily understood from FIG. 4F). The above layers can be formed in the same manner as in the above embodiments.

Figure 4D:
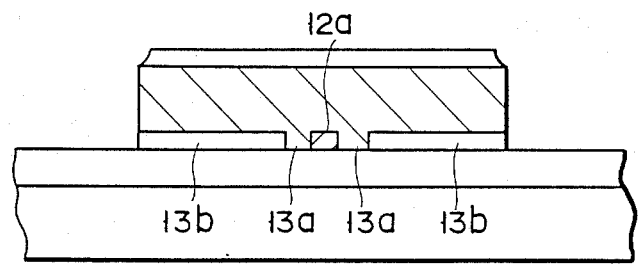

Then, as shown in FIG. 4D, exposed portions of layer 12, i.e., only regions 12b are selectively etched by a sulfuric acid + hydrogen peroxide + water (4 : 1 : 1) solution. Since such an etchant etches GaInAsP but does not etch InP, etching of regions 12b is automatically stopped at InP buried portions 13a and 13b. As a result, region 12a having a desired width can be left with very high reproducibility.

Then, as shown in FIG. 4E, SiO$_2$ film 18, p-side ohmic electrode 15, p-side electrode 16, and n-side electrode 17 are sequentially formed as in the first embodiment, thereby completing a buried type semiconductor laser device.

Also in the device manufactured as described above, supports (end portions 13b) formed integrally with layer 13 are partially interposed, at portions where they do not adversely affect the light-emitting characteristics, between layers 11 and 13 from which regions 12b are removed and support layer 13. As a result, the third embodiment has the same effects as those obtained by the above embodiments.

In the third embodiment, the supports (end portions 13b) are elongated to reach the periphery of mesa portion 20. However, as shown in FIG. 4G, the supports 13b can be shortened so that a gap is formed between their extending ends and film 18. The shape of the supports (end portions 13b) is not limited to the stripe but may be any shape as long as they project from central portion 13a while not adversely affecting the light-emitting characteristics. For example, as shown in FIG. 4H, the side surface of the supports 13b may be inclined so that the width is gradually increased toward the end portion. The supports need not be provided at the both sides of the element but may be provided at either of the two sides.

The fourth embodiment of the present invention will be described below with reference to FIGS. 5A to 5K.

Figure 5A:
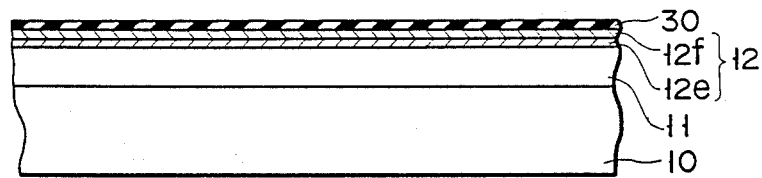
Figure 5B:
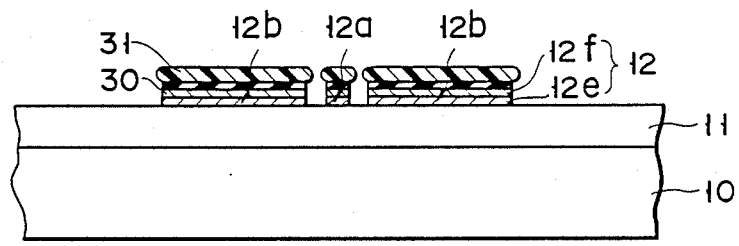
Figure 5C:
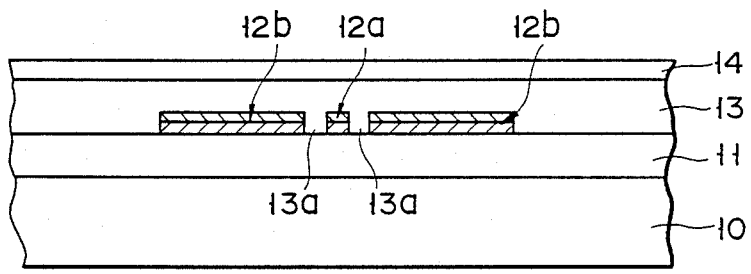
Figure 5D:
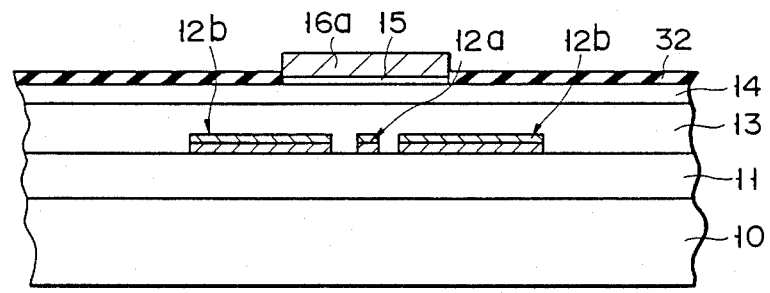
Figure 5E:
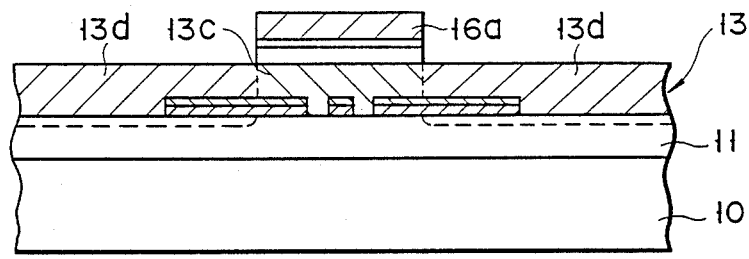
Figure 5F:
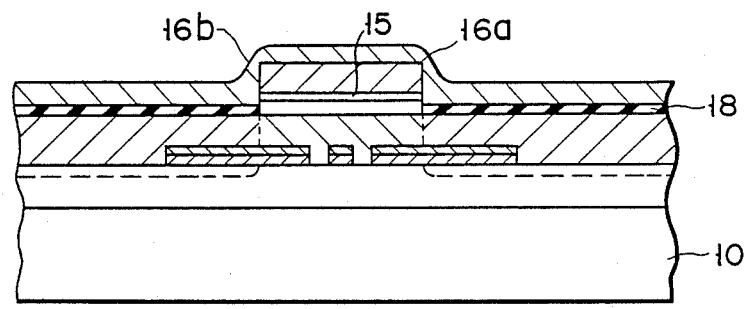
Figure 5G:
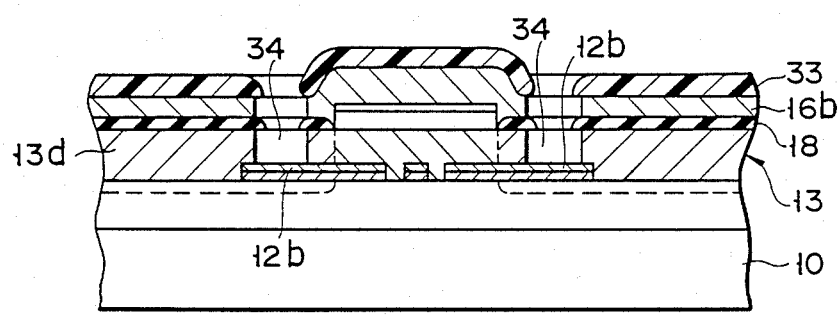
Figure 5H:
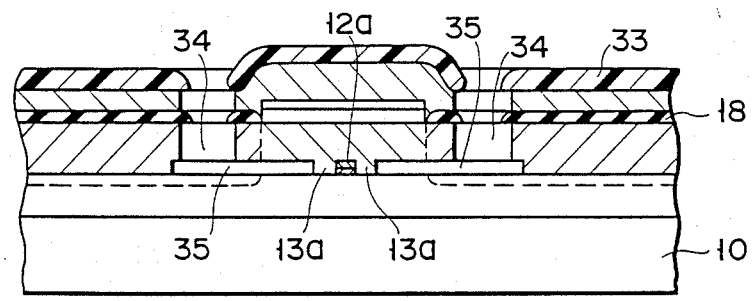

First, 1-$\mu$m thick n-type InP buffer layer 11 having a donor density of $3 \times 10^{18}$ cm$^{-3}$ and 0.2-$\mu$m thick active layer 12 are sequentially formed on n-type InP substrate 10 by a liquid phase epitaxial method. Layer 12 comprises 0.1-$\mu$m thick first layer 12e consisting of InGaAsP which corresponds to a wavelength of 1.55 $\mu$m and contributing to light emission and 0.1-$\mu$m second layer 12f consisting of InGaAsP which corresponds to a wavelength of 1.3 $\mu$m and contributing to light waveguide. Composition of layer 12 is set to be Ga$_x$In$_{(1-x)}$As$_y$P$_{(1-y)}$ ($0<y\leq1$). The value of x is given by $x=0.1894y/(0.4184-0.013y)$ to achieve lattice matching with substrate 10. In layer 12e, y of InGaAsP is about 0.9, and in layer 12f, y of InGaAsP is about 0.6. Then, SiO$_2$ layer 30 is formed on the entire surface of layer 12 by a CVD method as shown in FIG. 5A. Resist layer 31 is applied on layer 30 and patterned to partially expose layer 30. In this patterning, a pair of stripe openings separated in the transverse direction are formed at a central portion, and both end portions in the transverse direction are removed. As shown in FIG. 5B, the exposed portions of layer 30 and portions of layer 12 located below the exposed portions are removed by selective etching using patterned layer 31 as a mask. As a result, layer 12 is divided in central active region 12a and side active regions 12b separated by the stripe grooves. At this time, region 12a is formed to be a stripe having a width of about 1.5 $\mu$m. Then, after layers 31 and 30 are removed, clad or low-resistance layer 13 consisting of p-type InP having an acceptor density of $3 \times 10^{18}$ cm$^{-3}$ and a thickness of 1 $\mu$m and cap layer 14 consisting of p-type InGaAsP having an acceptor density of $3 \times 10^{18}$ cm$^{-3}$ and a thickness of 0.4 $\mu$m are formed on the entire surface (the upper surface of layer 12 and the exposed upper surface of layer 11) by a liquid phase epitaxial growth method, as shown in FIG. 5C. At this time, layer 13 partially extends into the grooves between region 12a and regions 12b to form buried portions 13a. Then, SiO$_2$ layer 32 is deposited on the entire surface of layer 14 by the CVD method and a rectangular opening is formed at a central portion in the transverse direction of layer 32, thereby exposing the central portion of layer 14. The dimension of the opening is set such that region 12a is located at the central portion and regions 12b are partially located at the end portions. In this embodiment, the width of the opening is set to be about 9.5 $\mu$m. Then, ohmic electrode 15 consisting of Au/AuZn/Au/Cr/Au is formed on the exposed portion of layer 14 using the SiO$_2$ layer as a mask by a lift off method. Then, as shown in FIG. 5D, 2-$\mu$m thick first layer 16a of a p-side electrode made of gold to be used as a mask later is deposited using electrode 15 as a base by electroplating. Layer 32 and portions of layer 14 located below layer 32 are removed by selective etching using layer 16a as a mask to expose side portions in the transverse direction of layer 13. Protons are implanted into the exposed portions of layer 13 using layer 16a as a mask. At this time, implantion energy of protons is about 150 KeV and the dose is $5 \times 10^{14}$ cm$^{-2}$. It will be understood that the protons are not implanted in a portion immediately below layer 16a because layer 16a serves as a mask. Then the resultant structure is annealed at a temperature of about 450° C. so that layer 15 is sintered to be alloyed and the region of layer 13 where protons are implanted obtains a high resistance, e.g., resistivity of $15^5$ $\Omega$cm or more. As a result, as shown in FIG. 5E, layer 13 is divided into low-resistance portion 13c having a width of about 9.5 $\mu$m and located at the center and high-resistance portions 13d located at both sides of portion 13c. Since the low-resistance portion has a mesa structure, it constitutes a mesa portion as in the above embodiments. The resistance of central layers 12 and 11 is not increased by this annealing. Then, SiO$_2$ film 18 is formed on the entire surface of the resultant structure. A portion of film 18 located on layer 16a is removed by selective etching. Ti/Pt/Au is deposited over the removed portion and film 18, and an Au layer is formed thereon, thereby forming second layer 16b of a p-side electrode, as shown in FIG. 5F. That is, the p-side electrode is constituted by layer 16a located on electrode 15 and layer 16b which is partially in contact with layer 16a. Then, resist layer 33 is formed on layer 16b, and window formation patterning of layer 33 for forming openings to be described later is performed. Layer 16b and a portion of film 18 located below layer 16b are selectively removed using layer 33 as a mask, thereby forming openings. High-resistance portion 13d of layer 13 is selectively removed by hydrochloric acid through the openings to form openings 34. Hydrochloric acid etches InP but does not etch InGaAsP. Therefore, etching is stopped at the upper surfaces of regions 12b and partially exposes the surfaces. As shown in FIG. 5G, openings 34 vertically extend and therefore are called vertical holes hereinafter. Then, etching is performed using an etchant consisting of sulfuric acid + hydrogen peroxide + water (4:1:1) for a sufficient long period of time to remove entire regions 12b, thereby forming openings 35. At this time, since etching in the transverse direction toward region 12a is stopped at buried portions 13a, region 12a is not etched. As shown in FIG. 5H, openings 35 horizontally extend and therefore are called horizontal holes hereinafter. It will be understood that vertical and horizontal holes 34 and 35 communicate with each other because regions 12b are removed through vertical holes 34. In this embodiment, each vertical hole 34 is a rectangle having dimensions of 5 μm×5 μm, and 10 vertical holes 34 are aligned in an array at 20 μm pitch. Two such arrays are symmetrically formed in an extending direction of region 12a to sandwich it. However, the pattern of vertical holes 34 is not limited to this one. Thereafter, as shown in FIG. 5I, layer 33 is removed to expose a p-side electrode, and n-type Au/Ge is deposited on substrate 10 to form n-side electrode 17. The semiconductor laser device manufactured as described above is shown in FIGS. 5J and 5K taken along lines different from that of FIG. 5I. FIG. 5J is a sectional view taken along line 5J—5J of FIGS. 5I and 5K, and FIGS. 5I and 5K are sectional views taken along line 5I—5I and line 5K—5K of FIG. 5J, respectively. It will be easily understood from these figures that although portions of high-resistance portions 13d of layer 13 near low-resistance portion 13c are completely separated from portions spaced apart from portion 13c by vertical holes 34 (FIG. 5I), they are actually integrally connected with each other (FIG. 5K), and that the portions of high-resistance portion 13d of layer 13 spaced apart from low-resistance portion 13c are directly located on layer 11 throughout a relatively wide range.

According to the semiconductor laser device having the above arrangement, an upper wide portion of low-resistance portion 13c of layer 13 is surrounded or sandwiched by high-resistance portions 13d, and its lower narrow portion is surrounded or sandwiched by horizontal holes 35. As a result, low-resistance portion 13c has the same shape as that of a clad layer of a conventional constricted mesa semiconductor laser device. Therefore, as in the conventional device, since homo p-n junctions (between low-resistance buried portions 13a of p-type clad layer 13 and n-type InP buffer layer 11) located at both sides of the active region have a narrow junction area, low leakage and capacitance can be obtained. Since the stripe width of a contact portion (first layer 16a) of the p-side electrode is much larger than that of the active region (central active region 12a), a series resistance can be reduced. In addition, a relatively thick high-resistance layer (high-resistance portion 13d) is interposed between the portion of second layer 16b of the p-side electrode serving as a bonding region and layer 11. Therefore, a parasitic capacitance at a pad portion can be reduced. As a result, high-speed response equivalent to or higher than that of the conventional constricted mesa type can be performed with a low leakage. The mechanical structure of this device is substantially planar. Low-resistance portion 13c of layer 13 is not mechanically supported by only region 12a and buried portions 13a but is formed integrally therewith. That is, low-resistance portion 13c is supported by high-resistance portions 13d fixed on layer 11 and is therefore mechanically very stable. SiO$_2$ film 18 which causes internal stress has no step and therefore need not be formed thick to cover undercuts. In addition, since a small parasitic capacitance can be obtained by high-resistance portions 13d, film 18 can be formed thin. As a result, strength, yield, reliability, and a cost can be largely improved.

The fifth embodiment of the present invention will be described below with reference to FIGS. 6A to 6C.

Figure 6A:
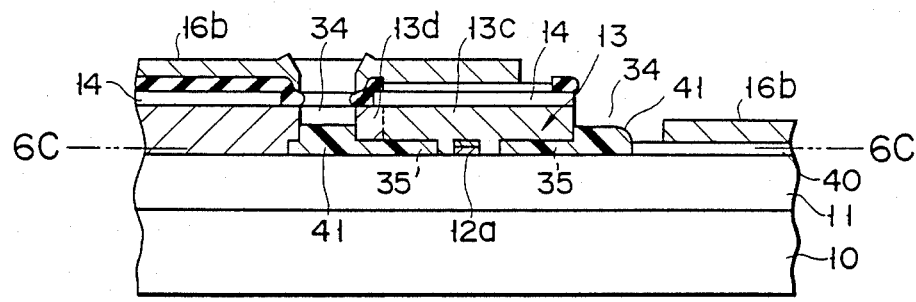
FIGS. 6A to 6C are sectional views showing a method of manufacturing a semiconductor laser device according to the fifth embodiment of the present invention in an order of steps.
Figure 6B:
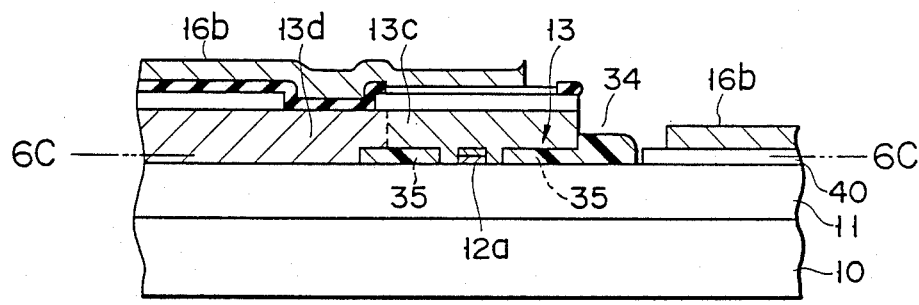
Figure 6C:
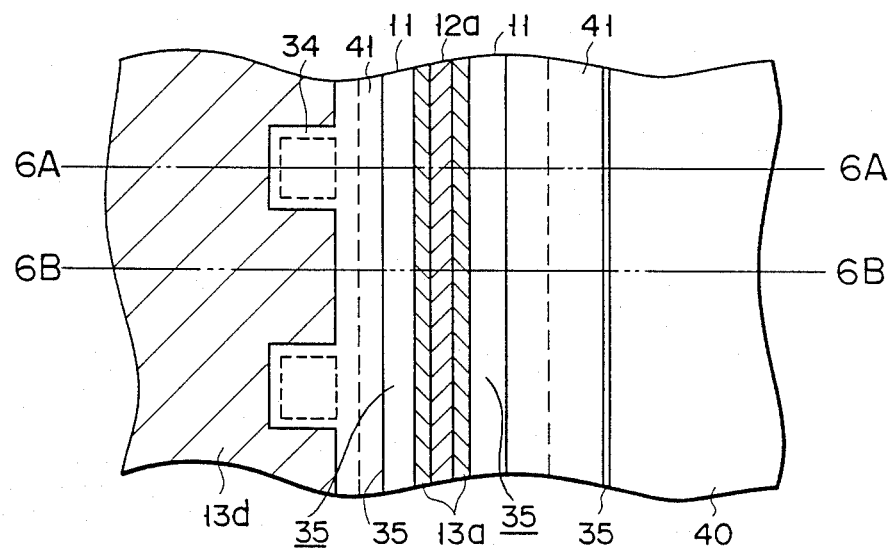

FIG. 6C is a sectional view taken along line 6C—6C of FIGS. 6A and 6B, and FIGS. 6A and 6B are sectional views taken along lines 6A—6A and 6B—6B of FIG. 6C, respectively.

In a semiconductor laser device of this embodiment, semi-insulating InP substrate 10 is used and the technique described in the fourth embodiment is adopted at one side (left side in FIGS. 6A to 6C) of central active region 12a. However, high-resistance portion 13d of clad layer 13 is removed from InP buffer layer 11 at the other side (right side in FIGS. 6A to 6C) and n-type ohmic electrode 40 is formed on the surface of removed layer 11. Layer of the other side 13 may be exposed before protons are implanted, i.e., before portion 13d obtains a high resistance. Even when low-resistance portion 13c of layer 13 is integrally supported only at its one side by high-resistance portion 13d as described above, the stress applied on region 12a is reduced.

In this embodiment, member 41 having a thermal expansion coefficient relatively close to that of InP such as polyimide resin is filled in vertical and horizontal holes 34 and 35 to prevent concentration of the stress into region 12a. It will be easily understood that such a member can be used in the embodiments described above. Unlike in the fourth embodiment, cap layer 14 is not removed, and protons are implanted therethrough. The high resistance of portion 13d obtained by implantation of protons can be further improved by increasing implantation energy of protons.

An impurity to be implanted in clad layer 13 to obtain a high resistance at a portion of layer 13 in the fourth and fifth embodiments is not limited to protons. For example, deuterium, tritium, helium, beryllium, and boron may be used singly or in a combination of two or more elements.

In the above embodiments, in order to reduce a leakage current or capacitance at the homo junction, a thin layer having a low carrier density may be formed in a junction of the clad layer. A semiconductor material used in the device is not limited to InGaAsP/InP. For example, AlGaAs, AlGaP, AlGaSb, and AlGaInAs may be used.

What is claimed is:

1. A semiconductor laser device comprising:
   a substrate having a first semiconductor layer of a first conductivity type;
   a mesa portion having a second semiconductor layer of a second conductivity type formed above said first semiconductor layer;
   an active region, formed between said first and second semiconductor layers, having a predetermined width, and consisting of a semiconductor having a forbidden band width smaller than those of said first and second semiconductor layers, said active regions having opposed edge surfaces which serve as mirrors, oscillate a laser beam between said edge surfaces and emit said laser beam from one of said edge surfaces, thereby contributing to light emission;

a pair of buried portions formed at both sides in a widthwise direction of and in contact with said active region and consisting of a semiconductor having a forbidden band width larger than that of said active region;

electrical insulating regions formed at both sides of said buried portions and between said first and second semiconductor layers;

supporting means for mechanically supporting said mesa portion with respect to said substrate to prevent stress concentration in said active region; and first and second electrodes respectively provided on said mesa portion and said substrate.

2. A semiconductor laser device comprising:

a substrate having a first semiconductor layer of a first conductivity type;

a mesa portion having a predetermined width and a second semiconductor layer of a second conductivity type formed above said first semiconductor layer by a predetermined interval;

an active region, formed between said first and second semiconductor layers and consisting of a semiconductor having a forbidden band width smaller than those of said first and second semiconductor layers, said active region having opposed edge surfaces which serve as reflecting mirrors, oscillate a laser beam between said edge surfaces, and emit said laser beam from one of said edge surfaces, thereby contributing to light emission;

a pair of buried portions formed at both sides in a widthwise direction of and in contact with said active region and consisting of a semiconductor having a forbidden band width larger than that of said active region, a total width of said buried portions and said active region being smaller than that of said mesa portion, thereby forming a gap at a side of each of said buried portions between said first and second semiconductor layers to electrically insulate said first and second semiconductor layers;

supporting means formed integrally with one of said first and second semiconductor layers so as to support said mesa portion with respect to said substrate in association with said active region and said buried portions; and first and second electrodes respectively provided on said mesa portion and said substrate.

3. A device according to claim 2, wherein said supporting means includes at least one column portion formed between said first and second semiconductor layers to be spaced apart from said buried portions.

4. A device according to claim 3, wherein said supporting means includes a first group of column portions formed at predetermined intervals between said first and second semiconductor layers to be spaced apart from one of said buried portions and a second group of column portions formed at predetermined intervals between said first and second semiconductor layers to be spaced apart from the other of said buried portions.

5. A device according to claim 2, wherein said supporting means includes a projecting portion at an end of at least one of said buried portions, formed integrally with the end and extending in a widthwise direction.

6. A device according to claim 2, wherein said second semiconductor layer includes a low-resistance portion which constitutes said mesa portion, and said supporting means includes a high-resistance semiconductor portion formed on said substrate at at least one side of said low-resistance portion.

7. A device according to claim 6, wherein said high-resistance semiconductor portion includes opening portions formed at predetermined intervals and communicating with said gap.

8. A device according to claim 7, wherein said mesa portion and said supporting means have flat upper surfaces, and said first electrode is formed on the upper surfaces.

9. A device according to claim 8, wherein the upper surfaces of said mesa portions and said supporting means are located on substantially the same plane.

10. A device according to claim 2, further comprising an insulator filled in said gap and having substantially the same thermal expansion coefficient as that of said second semiconductor layer.

* * * * *